(12) United States Patent
Doyle

(10) Patent No.: US 7,250,807 B1
(45) Date of Patent: Jul. 31, 2007

(54) THRESHOLD SCALING CIRCUIT THAT MINIMIZES LEAKAGE CURRENT

(75) Inventor: James Thomas Doyle, Nederland, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/454,882

(22) Filed: Jun. 5, 2003

(51) Int. Cl.
*G05F 3/02* (2006.01)
(52) U.S. Cl. ....................... 327/534; 327/535
(58) Field of Classification Search ................ 327/362, 327/534, 536, 535, 537; 363/59
See application file for complete search history.

(56) References Cited

U.S. PATENT DOCUMENTS

| | | | |
|---|---|---|---|
| 6,239,651 B1 * | 5/2001 | Fournel | 327/536 |
| 6,429,723 B1 * | 8/2002 | Hastings | 327/536 |
| 6,489,833 B1 * | 12/2002 | Miyazaki et al. | 327/534 |
| 6,538,930 B2 * | 3/2003 | Ishii et al. | 365/189.09 |
| 6,630,857 B2 * | 10/2003 | Mizuno et al. | 327/534 |
| 2003/0085751 A1 * | 5/2003 | Miyazaki et al. | 327/534 |
| 2003/0112695 A1 * | 6/2003 | Fujisawa et al. | 365/230.03 |
| 2004/0070440 A1 * | 4/2004 | Tang et al. | 327/534 |
| 2004/0183585 A1 * | 9/2004 | Mizuno et al. | 327/534 |

* cited by examiner

*Primary Examiner*—Tuan T. Lam
(74) *Attorney, Agent, or Firm*—Mark C. Pickering

(57) ABSTRACT

The leakage current output by a MOS transistor is minimized by varying a back bias voltage across a range of voltages, and detecting the back bias voltage within the range that minimizes the leakage current output by the MOS transistor. The detected back bias voltage is then applied to the MOS transistor.

29 Claims, 2 Drawing Sheets

THRESHOLD SCALING CIRCUIT THAT MINIMIZES LEAKAGE CURRENT

DETAILED DESCRIPTION OF THE INVENTION

Figure 1:
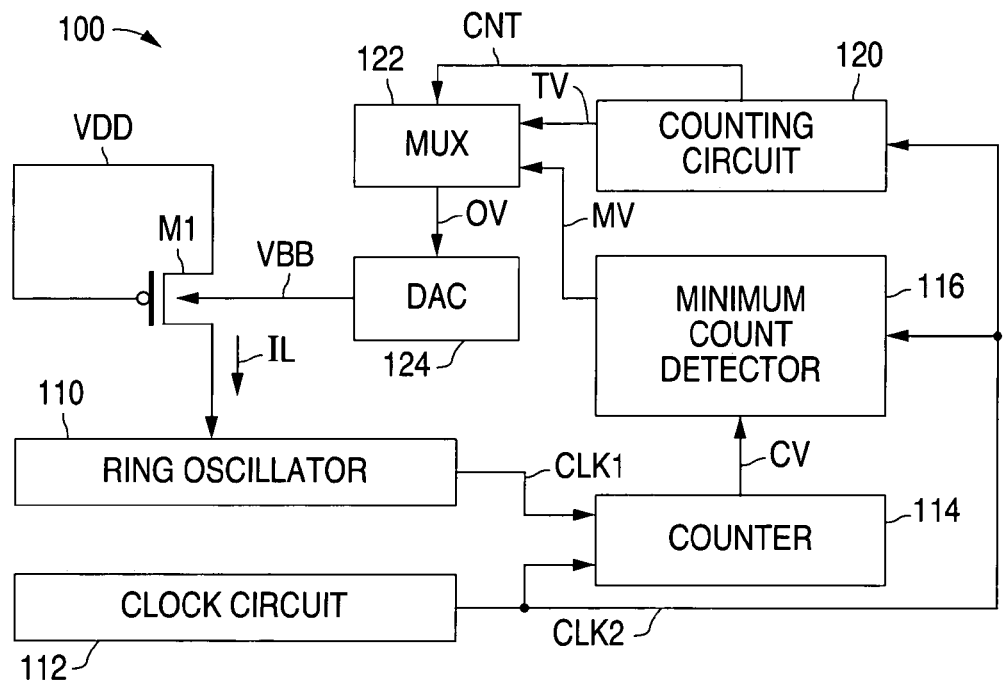
FIG. 1 is a block diagram illustrating an example of a threshold scaling circuit 100 in accordance with the present invention.

FIG. 1 shows a block diagram that illustrates an example of a threshold scaling circuit 100 in accordance with the present invention. As described in greater detail below, circuit 100 detects a back bias voltage that minimizes the leakage current output by a MOS transistor, and then sets the back bias voltage to the detected voltage.

As shown in FIG. 1, threshold scaling circuit 100 includes a PMOS transistor M1 that has a gate and a source connected to a power supply voltage VDD, a drain, and a body connected to receive a back bias voltage VBB. In operation, PMOS transistor M1, which is turned off, outputs a leakage current IL with a magnitude that is a function of the magnitude of the back bias voltage VBB. Transistor M1 is relatively large, and is capable of outputting micro amps of leakage current.

As further shown in FIG. 1, threshold scaling circuit 100 also includes a ring oscillator circuit 110 that outputs a first clock signal CLK1 with alternating rising and falling edges in response to the leakage current IL. Ring oscillator 110, which has a number of stages connected together to form a ring, outputs the first clock signal CLK1 with a frequency that is defined by the magnitude of the leakage current IL and the number of stages (load capacitance) of the ring.

Figure 2:
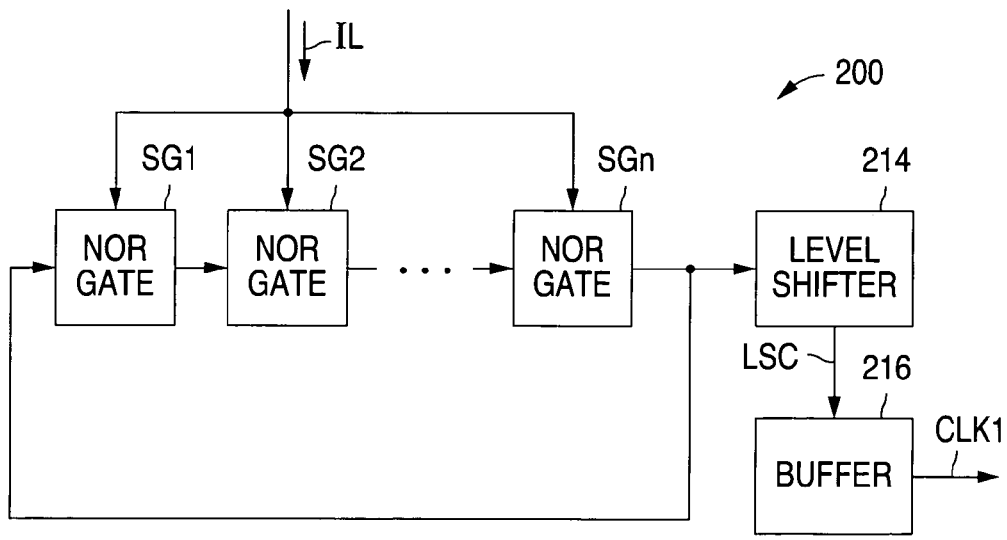
FIG. 2 is a block diagram illustrating an example of a ring oscillator circuit 200 in accordance with the present invention.

FIG. 2 shows a block diagram that illustrates an example of a ring oscillator circuit 200 in accordance with the present invention. As shown in FIG. 2, ring oscillator 200 includes a series of inverting stages SG1–SGn where the output of the last stage SGn forms the input of the first stage SG1.

For example, ring oscillator 200 can be implemented with 23 inverting stages. In addition, the inverting stages SG1–SGn can be implemented with NOR gates, inverters, differential amplifiers, or other inverting circuits such that, for each stage SG, the logic state of the signal output by a stage SG is the logic inverse of the signal input to the stage SG.

As further shown in FIG. 2, ring oscillator 200 also includes a level shifter 214 that level shifts the signal output from the last stage SGn to generate a level shifted clock signal LSC, and a buffer 216 that buffers the level shifted clock signal LSC to generate the first clock signal CLK1.

Returning to FIG. 1, threshold scaling circuit 100 additionally includes a clock circuit 112 that outputs a second clock signal CLK2 with alternating rising and falling edges. Clock circuit 112 includes a clock generator, such as a crystal oscillator or a ring oscillator, that generates a clock signal with a fixed frequency. In addition, clock circuit 112 can also include a clock divider that divides down the frequency of the clock signal to output the second clock signal CLK2.

As described in greater detail below, when detecting a back bias voltage that minimizes the leakage current output by PMOS transistor M1, the frequency of the first clock signal CLK1 is varied within a range of frequencies by varying the magnitude of the leakage current IL which, as described above, is a function of the magnitude of the back bias voltage VBB.

The second clock signal CLK2, in turn, has a frequency that is substantially less than the lowest frequency in the range of frequencies of the first clock signal CLK1. For example, the first clock signal CLK1 can have a frequency that varies within a frequency range of 80 MHz–120 MHz, while the second clock signal CLK2 can have a frequency of 1 MHz. Otherwise, the specific frequencies of the first and second clock signals CLK1 and CLK2, respectively, are not critical to the operation of circuit 100.

As further shown in FIG. 1, threshold scaling circuit 100 includes a counter 114 that counts the edges of the first clock signal CLK1 in response to the edges of the second clock signal CLK2 to generate a series of count values CV. Counter 114 is reset in response to the rising edges of the second clock signal CLK2 such that each count value CV represents the number of edges of the first clock signal CLK1 that occur during a period defined by a pair of edges of the second clock signal CLK2.

For example, when the first clock signal CLK1 has a frequency of 100 MHz and the second clock signal CLK2 has a frequency of 1 MHz, 100 rising edges of the first clock signal CLK1 are present during a period defined by an adjacent pair of rising edges of the second clock signal CLK2.

Since counter 114 is reset in response to the rising edges of the second clock signal CLK2, counter 114 begins counting from zero in response to a first rising edge of the second clock signal CLK2, and counts 100 rising edges of the first clock signal CLK1 before the next rising edge of the second clock signal CLK2 again resets the count. In this case, counter 114 outputs a count value CV of 100.

Further, the count can be bounded by non-adjacent edges of the second clock signal CLK2. For example, each count value CV can represent the number of edges of the first clock signal CLK1 that occur during a period defined by every other rising edge of the second clock signal CLK2.

As additionally shown in FIG. 1, threshold scaling circuit 100 also includes a minimum count detector 116 that evaluates the series of count values CV output by counter 114 to determine, store, and output a minimum count value MV. As described in greater detail below, counter 114 outputs a series of count values that step downwards towards a minimum, and then step back upwards away from the minimum.

For example, assume that counter 114 outputs the following series of count values: 120, 110, 100, 110, and 120. In this case, the count steps downward to a minimum of 100, and then steps back upwards. Minimum count detector 116 determines that the 100 count value is the minimum, and outputs the 100 count value as the minimum count value MV.

Figure 3:
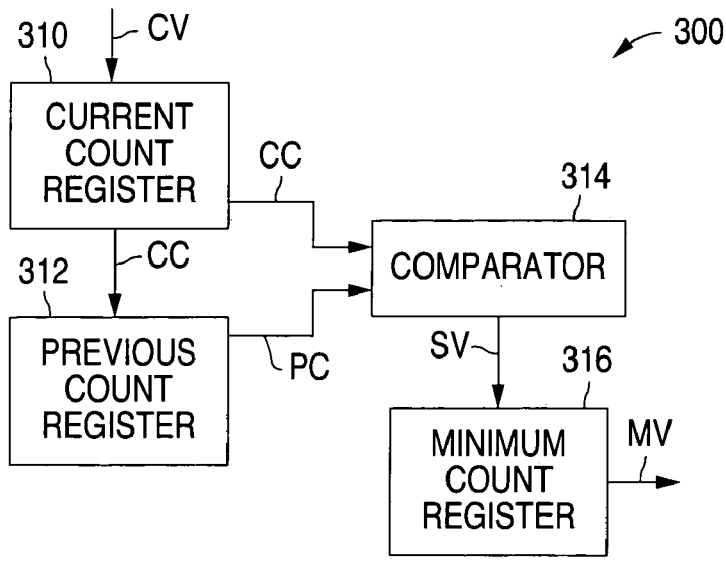
FIG. 3 is a block diagram illustrating an example of a minimum count detector 300 in accordance with the present invention.

FIG. 3 shows a block diagram that illustrates an example of a minimum count detector 300 in accordance with the present invention. As shown in FIG. 3, minimum count detector 300 includes a current count register 310 that latches and outputs the count value CV output from counter 114 as a current count CC each time a rising edge of the second clock signal CLK2 is detected. Care must be taken to insure that the count value CV output from counter 114 is latched by register 310 before the count value CV held by counter 114 is reset.

In addition, minimum count detector 300 includes a previous count register 312 that latches and outputs the current count CC held by current count register 310 as a previous count PC each time a rising edge of the second clock signal CLK2 is detected. As above, care must be taken to insure that the current count CC output from register 310 is latched by register 312 before the current count CC held by register 310 is overwritten by the output from counter 114.

For example, assume that counter 114 counts 120 edges of the first clock signal CLK1 during a first period of the second clock signal CLK2, and 110 edges during a second period of the second clock signal CLK2. In this example, at the end of the second clock period, previous count register 312 stores a value of 120, while current count register 310 stores a value of 110.

As further shown in FIG. 3, minimum count detector 300 includes a comparator 314 that compares the current count CC to the previous count PC each time count values are latched into current count register 310 and previous count register 312 to determine the register that holds the smallest count.

In addition, comparator 314 outputs the smallest count as a smallest count value SV when the current count CC held by register 310 is less than the previous count PC held by register 312. When the current count CC is less than the previous count PC, the direction of the count is down towards the minimum.

For example, assume that counter 114 outputs the following series of count values: 120, 110, 100, 110, and 120. In this case, after the 120 count value has been latched by previous count register 312 and the 110 count value has been latched by current count register 310, comparator 314 compares the 120 count value with the 110 count value. Comparator 314 determines that the 110 count value held by register 310 is the smallest, and outputs the 110 count value as the smallest count value SV.

After the 110 count value has been latched by previous count register 312 and the 100 count value has been latched by current count register 310, comparator 314 compares the 110 count value with the 100 count value. Comparator 314 determines that the 100 count value held by register 310 is the smallest, and outputs the 100 count value as the smallest count value SV.

After the 100 count value has been latched by previous count register 312 and the 110 count value has been latched by current count register 310, comparator 314 compares the 100 count value with the 110 count value. Comparator 314 determines that the 100 count value held by register 312 is now the smallest count. When the smallest count is held by register 312, the direction of the count has turned upwards away from the minimum. As a result, comparator 314 does not output the smallest count as the smallest count value SV.

After the 110 count value has been latched by previous count register 312 and the 120 count value has been latched by current count register 310, comparator 314 compares the 110 count value with the 120 count value. Comparator 314 determines that the 110 count value held by register 312 is the smallest count. As a result, comparator 314 does not output the smallest count as the smallest count value SV.

As additionally shown in FIG. 3, minimum count detector 300 further includes a minimum count register 316 that stores the smallest count value SV output by comparator 314 each time comparator 314 outputs a smallest count value SV, and outputs the smallest count value SV as the minimum count value MV.

Referring again to FIG. 1, threshold scaling circuit 100 includes a counting circuit 120 that incrementally steps through a count range in response to the rising edges of the second clock signal CLK2. The count range has a series of steps and a corresponding series of counts. In addition, counting circuit 120 outputs a step value TV at each step that represents the count of the step.

For example, counting circuit 120 can be implemented with a down counter that incrementally steps through a count range of 1111 1111 to 0000 0000, sequentially outputting the step values TV of 1111 1111, 1111 1110, 1111 1101, . . . 0000 0000 in response to the rising edges of the second clock signal CLK2. When counting circuit 120 reaches the end of the range, 0000 0000 in this example, the count stops until subsequently reset.

Alternately, counting circuit 120 can be implemented with an up counter that incrementally steps through a count range of 0000 0000 to 1111 1111, sequentially outputting the step values TV of 0000 0000, 0000 0001, 0000 0010, . . . 1111 1111 in response to the rising edges of the second clock signal CLK2. When counting circuit 120 reaches the end of the range, 1111 1111 in this example, the count stops until subsequently reset.

In addition to stepping through a count range, counting circuit 120 also generates a control signal CNT that changes logic states when the count reaches the end of the range. For example, counting circuit 120 can change the logic state of the control signal CNT when a down count transitions from 0000 0001 to 0000 0000. Alternately, counting circuit 120 can change the logic state of the control signal CNT when an up count transitions from 1111 1110 to 1111 1111.

Threshold scaling circuit 100 further includes a multiplexer 122 and a digital-to-analog converter circuit 124. Multiplexer 122 passes either the step value TV output by counting circuit 120 or the minimum count value MV output by minimum count detector 116 as an output value OV, depending on the logic state of the control signal CNT.

Digital-to-analog converter circuit 124 converts the step value TV or the minimum count value MV into the back bias voltage VBB. Circuit 124 includes a digital-to-analog converter (DAC) that generates an analog signal in response to the output value OV, and a push-pull operational transconductance amplifier (OTA) that amplifies the analog signal to output a current that generates the back bias voltage VBB. An OTA eliminates a phase shift that is present in a voltage amplifier. MOS transistor M1 presents a relatively large capacitive load, e.g., 1 nF, which the DAC is unable to drive without amplification.

In operation, the leakage current IL output by PMOS transistor M1 is minimized by sweeping the back bias voltage VBB across a range of voltages to detect the back bias voltage VBB within the range that minimizes the leakage current IL output by PMOS transistor M1. The detected back bias voltage VBB is then applied to the well of PMOS transistor M1, and to the wells of other PMOS transistors in the same power domain. As a result, threshold scaling circuit 100 sets the back bias voltage for the PMOS transistors in a power domain, thereby minimizing the leakage current consumed by the power domain and saving power.

The back bias voltage VBB is swept across a range of voltages in response to the step values TV that are sequentially output by counting circuit 120. In the case of a down counter, the incrementally decreasing count causes the back bias voltage VBB output by DAC circuit 124 to incrementally decrease.

In the present example, DAC circuit 124 is implemented such that the step value TV that represents the largest voltage in the range is above the rail. Voltages that are outside of the normal supply rails, such as 1.2V, can be obtained by regulation from other available supplies, such as 3.3V I/O voltages, or charge pumps.

The leakage current IL output by PMOS transistor M1 is a function of the back bias voltage VBB, and follows a bell or bowl shaped curve which has a minimum. Thus, as the back bias voltage VBB output by DAC circuit 124 incrementally decreases, the leakage current IL output by PMOS transistor M1 decreases until a minimum is reached, and then increases.

As the leakage current IL decreases and then increases, the frequency of the first clock signal CLK1, which is directly proportional to magnitude of the leakage current IL, decreases to a minimum and then increases. Counter 114 measures the frequency of the first clock signal CLK1 by counting the number of edges that occur between edges of the second clock signal CLK2.

Thus, as the frequency of the first clock signal CLK1 decreases and then increases, the count value measured by counter 114 decreases and then increases. Minimum count detector 116 receives the count values output by counter 114, and detects and stores the minimum count value that occurs.

When counting circuit 120 reaches the end of the counting range, thereby completing the sweep, logic circuitry within counting circuit 120 changes the logic state of the control signal CNT. This causes multiplexer 122 to pass the minimum count value MV stored by minimum count detector 116 which, in turn, sets the back bias voltage VBB output by DAC circuit 124 to a value that minimizes the leakage current of PMOS transistor M1. The output of DAC circuit 124 is also provided to the wells of the other PMOS transistors in the same power domain, thereby reducing the power consumed by the power domain.

Figure 4:
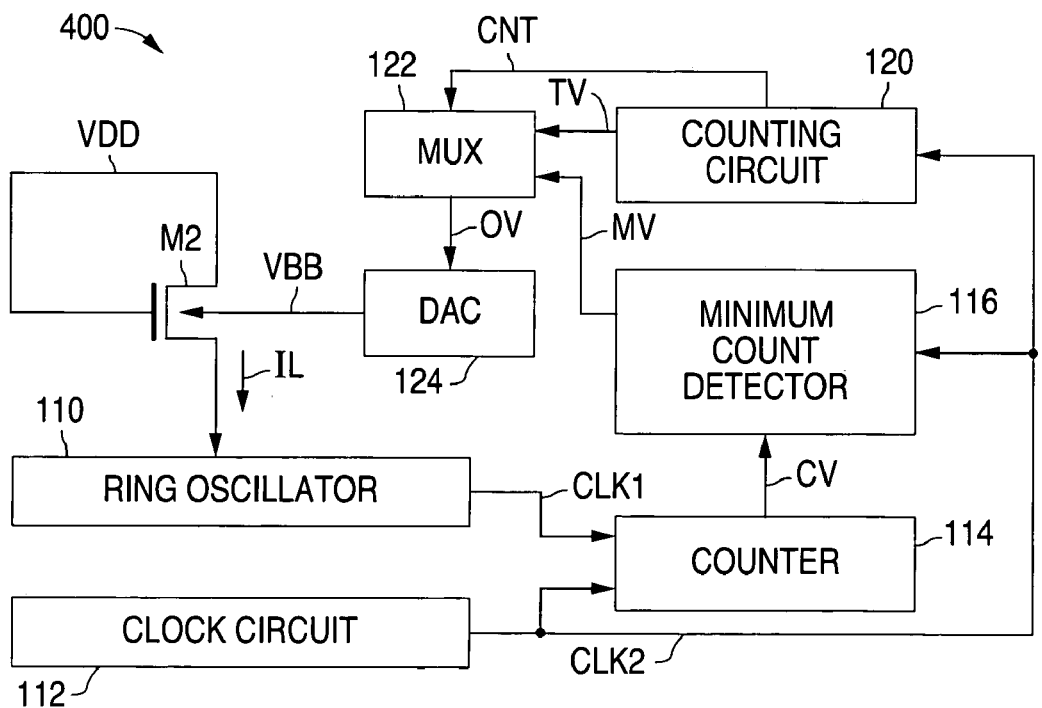
FIG. 4 is a block diagram illustrating an example of a threshold scaling circuit 400 in accordance with the present invention.

FIG. 4 shows a block diagram that illustrates an example of a threshold scaling circuit 400 in accordance with the present invention. Circuit 400 is similar to circuit 100 and, as a result, utilizes the same reference numerals to designate the structures that are common to both circuits.

As shown in FIG. 4, threshold scaling circuit 400 differs from threshold scaling circuit 100 in that circuit 400 utilizes an NMOS transistor M2 to detect and minimize the leakage currents of the NMOS transistors in a power domain. In addition, DAC circuit 124 of circuit 400 is implemented such that the step value TV that represents the smallest voltage in the range is below the ground rail. Voltages that are below the ground rail can be obtained from other available supplies or charge pumps.

Threshold scaling circuits 100 and 400 can be used together in the same power domain. In this case, circuit 100 minimizes the leakage currents of the PMOS transistors in the power domain while circuit 400 minimizes the leakage currents of the NMOS transistors in the power domain.

Threshold scaling circuits 100 and 400 can also be used in conjunction with an adaptive voltage scaling circuit. Thus, when an adaptive voltage scaling circuit reduces the supply voltage and enters a low power standby mode, circuits 100 and 400 can determine the back bias voltage that minimizes the leakage current. Further, circuits 100 and 400 can be reset as needed to re-determine the back bias voltage that minimizes the leakage current. This can be particularly useful when temperature extremes are expected.

One of the advantages of the present invention is that circuits 100 and 400 are adaptive. The back bias voltage VBB that provides the minimum leakage current IL is technology and chip dependent. The present invention independently optimizes the back bias voltage that provides the minimum leakage current, thereby resolving differences in process, voltage, and temperature (PVT) across different die. In addition, PMOS transistor M1 and NMOS transistor M2 are formed in double well or triple well structures to provide isolated substrates. This, in turn, allows the back bias voltage VBB to be swept over a wide range.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A threshold scaling circuit comprising:
   a MOS transistor connected to output a current, the transistor having a gate, a first terminal, a second terminal, and a body connected to receive a back bias voltage;
   a first clock circuit connected to output a first clock signal, the first clock signal having a plurality of first edges, and a frequency that varies in response to a magnitude of the current, the first clock circuit being connected to the transistor to receive the current;
   a second clock circuit connected to output a second clock signal, the second clock signal having a plurality of second edges;
   a counter connected to count the plurality of first edges to generate a sequence of count values, each count value representing a number of first edges of the first clock signal that occur during a period defined by a pair of second edges, the counter being connected to the first clock circuit to receive the first clock signal and the second clock circuit to receive the second clock signal;
   a minimum count detector connected to evaluate the sequence of count values to determine a minimum count value, and store the minimum count value, the minimum count detector being connected to the counter to receive the count values;
   a counting circuit connected to step through a count range in response to the second clock signal, the count range having a sequence of steps and a corresponding sequence of counts, the counting circuit being connected to output a step value at each step that represents the count of the step, the counting circuit being connected to the second clock circuit to receive the second clock signal;
   a multiplexer connected to pass either a step value output by the counting circuit or the minimum count value output by the minimum count detector as an output value, the multiplexer being connected to the counting circuit to receive the step value at each step and the minimum count detector to receive the minimum count value; and
   a digital-to-analog converting circuit connected to convert the output value into the back bias voltage, the digital-to-analog converting circuit being connected to the multiplexer to receive the output value.

2. The circuit of claim 1 wherein the MOS transistor is a p-channel transistor.

3. The circuit of claim 1 wherein the MOS transistor is an n-channel transistor.

4. The circuit of claim 1 wherein the frequency of the first clock signal varies within a range of frequencies.

5. The circuit of claim 4 wherein the second clock signal has a frequency that is less than a lowest frequency within the range of frequencies.

6. The circuit of claim 1 wherein the period is defined by an adjacent pair of second edges.

7. The circuit of claim 6 wherein the first edges are rising edges.

8. The circuit of claim 6 wherein the second edges are rising edges.

9. The circuit of claim 1 wherein the minimum count detector includes:
   a current count register that latches and outputs the count value output from the counter as a current count;
   a previous count register that latches and outputs the current count held by the current count register as a previous count;
   a comparator that compares the current count to the previous count each time count values are latched into the current count register and the previous count register to determine the register that holds a smallest count.

10. The circuit of claim 9 wherein the comparator outputs the smallest count as a smallest count value when the current count held by the current count register is less than the previous count held by the previous count register.

11. The circuit of claim 10 wherein the minimum count detector further includes a minimum count register that stores the smallest count value output by the comparator each time the comparator outputs a smallest count value, and outputs the smallest count value as the minimum count value.

12. The circuit of claim 1 wherein the first clock circuit is a ring oscillator.

13. The circuit of claim 1 wherein the counting circuit counts down from a first value to a second value.

14. The circuit of claim 1 wherein the counting circuit outputs a control signal, and the multiplexer passes the step value or the minimum count value as the output value depending on a logic state of the control signal CNT.

15. A method of setting a back bias condition to a value that minimizes leakage, the method comprising:
   sweeping a back bias voltage across a range of voltages;
   detecting a low-leakage back bias voltage within the range that minimizes a leakage current output by a transistor, the transistor being formed in a substrate region; and
   applying the low-leakage back bias voltage to the substrate region.

16. The method of claim 15 wherein the sweeping includes:
   stepping through a count range that has a sequence of steps and a corresponding sequence of counts, and outputting a step value at each step that represents the count of the step; and
   converting the step value at each step into a back bias voltage.

17. The method of claim 15 wherein the detecting further includes:
   outputting a first clock signal in response to the leakage current, the first clock signal having a plurality of first edges;
   outputting a second clock signal that has a plurality of second edges;
   counting the plurality of first edges to generate a sequence of count values, each count value representing a number of first edges of the first clock signal that occur during a period defined by a pair of second edges;
   evaluating the plurality of count values to determine a minimum count value; and
   storing the minimum count value.

18. The method of claim 17 wherein the applying further includes:
   detecting when a last step of the sequence of steps has been reached; and
   converting the minimum count value into a back bias voltage when the last step of the sequence of steps has been reached.

19. A threshold scaling circuit comprising:
   a transistor connected to output a leakage current; and
   a minimum value detector connected to generate a series of numerical values that each represents a magnitude of the leakage current, and identify a smallest magnitude of the leakage current based on the numerical values, the minimum value detector being connected to the transistor to receive the leakage current.

20. The threshold scaling circuit of claim 19 and further comprising a voltage source connected to output a bias voltage to the transistor, a magnitude of the bias voltage varying over a calibration period of time, the transistor varying the magnitude of the leakage current in response to the magnitude of the bias voltage over the calibration period of time.

21. The threshold scaling circuit of claim 20 wherein the voltage source outputs a single bias voltage after the calibration period of time and before a next calibration period of time, the transistor outputting the leakage current with a magnitude substantially equal to the smallest magnitude in response to the single bias voltage.

22. The threshold scaling circuit of claim 21 wherein the minimum value detector includes:
   a first clock circuit connected to output a first clock signal, the first clock signal having a plurality of first clock edges, and a frequency that varies in response to the magnitude of the leakage current;
   a second clock circuit connected to output a second clock signal, the second clock signal having a plurality of second clock edges;
   a counter connected to generate a numerical value that represents a magnitude of the leakage current by counting a number of first clock edges that occur during a time period bounded by a pair of second clock edges, the counter being connected to the first clock circuit to receive the first clock signal and second clock circuit to receive the second clock signal.

23. The threshold scaling circuit of claim 22 wherein the minimum value detector includes a minimum count detector connected to compare the numerical value of a current magnitude with the numerical value of a prior magnitude to determine and save a lowest numerical value.

24. The threshold scaling circuit of claim 23 wherein the minimum value detector includes a selection circuit connected to output a succession of numerical values to the voltage source during the calibration period of time, and the lowest numerical value to the voltage source after the calibration period of time and before the next calibration period of time.

25. A threshold scaling circuit comprising:
   a transistor connected to output a leakage current, the transistor having a region connected to receive a bias voltage, the leakage current having a magnitude that varies within a range of magnitudes in response to variations in a magnitude of the bias voltage, the range of magnitudes being bounded by a minimum leakage current and a maximum leakage current;

a minimum value detector connected to the transistor to receive the leakage current, and make a determination of the minimum magnitude of the leakage current within the range of magnitudes, the minimum value detector outputting an indication of the minimum magnitude of the leakage current that represents the determination so that the indication of the minimum magnitude of the leakage current is distinguishable from other magnitudes within the range of magnitudes that are less than the maximum magnitude; and a voltage source connected to generate the bias voltage, vary the magnitude of the bias voltage over a period of time, and set the magnitude of the bias voltage in response to the indication, the voltage source being connected to the transistor to output the bias voltage and the minimum value detector to receive the indication, the voltage source comprising:

a counting circuit that outputs a number of different values one at a time;

a multiplexer that passes either a value output by the counting circuit or the indication output by the minimum value detector as an output value; and a digital-to-analog converting circuit connected to the multiplexer and the transistor that converts the output value into the bias voltage.

26. A threshold scaling circuit comprising:

a transistor connected to output a leakage current, the transistor having a region connected to receive a bias voltage, the leakage current having a magnitude that varies within a range of magnitudes in response to variations in a magnitude of the bias voltage, the range of magnitudes being bounded by a minimum leakage current and a maximum leakage current;

a minimum value detector connected to the transistor to receive the leakage current, and make a determination of the minimum magnitude of the leakage current within the range of magnitudes, the minimum value detector outputting an indication of the minimum magnitude of the leakage current that represents the determination so that the indication of the minimum magnitude of the leakage current is distinguishable from other magnitudes within the range of magnitudes that are less than the maximum magnitude, the minimum value detector comprising:

a measuring circuit connected to the transistor to detect the magnitude of the leakage current a number of times over the period of time, and output a number of leakage values that represent the magnitude of the leakage current at the number of times during the period of time; and a minimum value circuit connected to the measuring circuit and the voltage source that determines a leakage value that represents the minimum magnitude of the leakage current to form the indication; and a voltage source connected to generate the bias voltage, vary the magnitude of the bias voltage over a period of time, and set the magnitude of the bias voltage in response to the indication, the voltage source being connected to the transistor to output the bias voltage and the minimum value detector to receive the indication.

27. The circuit of claim 26 wherein the measuring circuit comprises:

a first circuit connected to the transistor, the first circuit outputting a first signal in response to the leakage current at a time of the number of times, the first signal having a plurality of first edges;

a second circuit that outputs a second signal, the second signal having a plurality of second edges; and a counter connected to the first and second circuits, the counter counting first edges to output a counter measure that represents a number of first edges of the first signal that occur during a period defined by two second edges, the counter measure representing a leakage value.

28. The circuit of claim 27 wherein:

the first signal has a frequency that varies within a range of frequencies; and the second signal has a frequency that is substantially less than a lowest frequency within the range of frequencies.

29. The circuit of claim 27 wherein the minimum value circuit includes:

a current count register that latches and outputs the counter measure output from the counter as a current count;

a previous count register that latches and outputs the current count held by the current count register as a previous count;

a comparator that compares the current count to the previous count each time count values are latched into the current count register and the previous count register to determine the register that holds a smallest count.

* * * * *